(12) United States Patent
Maeda et al.

(10) Patent No.: US 9,074,728 B2
(45) Date of Patent: Jul. 7, 2015

(54) HANDLER AND PART INSPECTING APPARATUS

(71) Applicant: Seiko Epson Corporation, Tokyo (JP)

(72) Inventors: Masami Maeda, Suwa (JP); Toshioki Shimojima, Suwa (JP)

(73) Assignee: Seiko Epson Corporation (JP)

( * ) Notice: Subject to any disclaimer, the term of this patent is extended or adjusted under 35 U.S.C. 154(b) by 325 days.

(21) Appl. No.: 13/765,026

(22) Filed: Feb. 12, 2013

(65) Prior Publication Data
US 2013/0205804 A1    Aug. 15, 2013

(30) Foreign Application Priority Data

Feb. 14, 2012  (JP) ................................. 2012-029178

(51) Int. Cl.
*F17C 7/04* (2006.01)
*F17C 9/02* (2006.01)

(52) U.S. Cl.
CPC ....................................... *F17C 9/02* (2013.01)

(58) Field of Classification Search
CPC ............... F17C 7/04; F17C 9/02; F17C 9/00; G06F 1/20
USPC .............. 62/48.1, 50.2, 53.2, 148, 166, 259.2
See application file for complete search history.

(56) References Cited

U.S. PATENT DOCUMENTS

| | | | |
|---|---|---|---|
| 3,080,725 A * | 3/1963 | Cowley et al. | 165/256 |
| 3,092,974 A * | 6/1963 | Haumann et al. | 62/62 |
| 6,616,769 B2 * | 9/2003 | Lachawiec et al. | 134/10 |
| 2012/0060517 A1 * | 3/2012 | Shimizu et al. | 62/48.1 |

FOREIGN PATENT DOCUMENTS

JP    2004-347329    12/2004

* cited by examiner

*Primary Examiner* — Melvin Jones
(74) *Attorney, Agent, or Firm* — Harness, Dickey & Pierce, P.L.C.

(57) ABSTRACT

A handler includes a storage tank which stores liquid nitrogen, supply channels which supply refrigerant from the storage tank to inner passages of a first shuttle, a valve which opens and closes the supply channel, and a heat exchanger which has vaporization chambers with larger flow path cross-sectional areas than those of the supply channels to vaporize liquid nitrogen within the vaporization chambers. According to this structure, the respective vaporization chambers are filled with nitrogen gas produced by preceding vaporization. Thus, pressure fluctuations produced by successive vaporization of liquid nitrogen can be reduced. Moreover, nitrogen gas is supplied to the respective inner passages. Accordingly, excessive cooling for part housing pockets can be prevented.

13 Claims, 3 Drawing Sheets ions and excessive cooling for the stage caused by vaporization of the liquefied gas can both be reduced.

HANDLER AND PART INSPECTING APPARATUS

BACKGROUND

1. Technical Field

The present invention relates to a handler which conveys a part, and more particularly to a handler provided with a temperature control unit for controlling the temperature of a part, and a part inspecting apparatus which includes the handler.

2. Related Art

A typical part inspecting apparatus which inspects the electric characteristics of an electronic part has a handler which conveys the electronic part before and after inspection between a tray on a base and an inspection socket. One such part inspecting apparatus inspects the electric characteristics of an electronic part kept in a low-temperature condition of 0° C. or lower.

For example, JP-A-2004-347329 discloses a method for cooling an electronic part to a low-temperature condition. According to the method of JP-A-2004-347329, a tray containing a plurality of electronic parts is placed on a stage. An inner passage is equipped inside the stage. Compressed air in a dry condition is cooled, and is supplied under the compressed and cooled condition to the inner passage of the stage. As a result, the tray is cooled via the stage, whereby the electronic parts can be cooled via the tray.

In addition to the technology shown in JP-A-2004-347329, there is another method for cooling an electronic part. According to this method, liquid nitrogen is supplied to the inner passage of the stage. This method can rapidly cool the stage, but produces the possibility of vaporization of a part of the liquid nitrogen within the inner passage of the stage. The volume of liquid nitrogen becomes approximately 700 times larger when vaporized at atmospheric pressure. Thus, the stage containing the inner passage and a discharge channel through which liquid nitrogen is discharged from the stage are required to have a sufficient level of pressure resistance for enduring the pressure fluctuations produced by vaporization of liquid nitrogen. Moreover, while the supply amount of liquid nitrogen is controlled such that the temperature of the stage changes to a target temperature, there is a possibility that the stage is excessively cooled to supply heat required for vaporization of liquid nitrogen within the inner passage of the stage.

SUMMARY

An advantage of some aspects of the invention is to provide a handler capable of reducing pressure fluctuations and excessive cooling for a stage caused by vaporization of liquefied gas, and a part inspecting apparatus including the handler.

A handler according to an aspect of the invention includes: a robot which conveys a part; a stage on which the part is supported; a supply unit to which liquefied gas produced by liquification of gas is supplied; a supply channel which connects the supply unit and a passage within the stage; a valve which opens and closes the supply channel; a heater which heats the stage; a temperature sensor which detects the temperature of the stage; a controller which controls the output of the heater and opening and closing of the valve such that the temperature detected by the temperature sensor becomes a predetermined temperature; and a vaporization vessel included along the way to the supply channel and having a larger flow path cross-sectional area than the corresponding area of the supply channel to vaporize the liquefied gas.

According to the handler of this aspect of the invention, the temperature of the stage can be adjusted to a predetermined temperature, and the liquefied gas enters the vaporization vessel before reaching the stage. The vaporization vessel has a larger flow path cross-sectional area than the corresponding area of the supply channel. In this case, the area and volume of the inside flow path of the vaporization vessel are larger than the corresponding area and volume of the supply channel. Thus, the liquefied gas having entered the vaporization vessel is vaporized and expanded by exposure to the interior of the vaporization vessel having a higher temperature than the boiling point of the liquefied gas. In this condition, pressure fluctuations are produced by vaporization of the liquefied gas within the vaporization vessel. However, the interior of the vaporization vessel is filled with the gas produced by preceding vaporization of the liquefied gas, therefore the pressure fluctuations caused by successive vaporization of the liquefied gas can be reduced. Then, the gas vaporized in the vaporization vessel is supplied to the passage within the stage, in which condition vaporization of the liquefied gas within the passage can be avoided. As a result, excessive temperature drop of the stage caused by supplying heat required for vaporization of the liquefied gas can be prevented. Accordingly, pressure fluctuat In the handler of the aspect of the invention, the valve may be provided in the supply channel on the upstream side with respect to the vaporization vessel.

According to the handler of this configuration, the valve is provided in the supply channel on the upstream side with respect to the vaporization vessel. When the valve is kept closed in a structure which positions the valve on the downstream side with respect to the vaporization vessel, the vaporization vessel located between the supply unit and the valve is also closed. In this case, it is expected that the pressure within the vaporization vessel increases as a result of vaporization of a part of the liquefied gas. Thus, the vaporization vessel is required to have pressure resistance sufficient for enduring the raised pressure. According to this aspect of the invention, however, the closed condition of the vaporization vessel can be avoided even while the valve is kept closed. Accordingly, the level of pressure resistance required for the vaporization vessel can be decreased.

The handler according to the aspect of the invention may further include a housing vessel which houses the stage, and a discharge channel which connects the passage within the stage and the interior of the housing vessel.

According to the handler of this configuration, the gas supplied to the passage within the stage contains almost no water. In this case, the housing vessel can be kept in the dry condition by supply of the gas discharged from the passage within the stage into the housing vessel. This structure can prevent dew condensation on the stage cooled to a low-temperature condition and the part supported by the stage.

In the handler of the aspect of the invention, a non-return valve which regulates the flow of gas into the passage within the stage may be provided in the discharge channel.

The handler of this configuration can prevent the flow of air containing a larger amount of water than that of the liquefied gas into the passage within the stage and the vaporization vessel through the discharge channel during the period of when the valve is closed, for example. Accordingly, dew condensation on the passage within the stage and the vaporization vessel can be avoided when cooling for the stage is restarted.

In the handler of the aspect of the invention, the passage may have a first inner passage and a second inner passage. The vaporization vessel may have a first vaporization chamber and a second vaporization chamber. The first inner passage may be connected with the first vaporization chamber. The second inner passage is connected with the second vaporization chamber.

According to the handler of this configuration, the gas vaporized in the first vaporization chamber is supplied to the first inner passage. Moreover, the gas vaporized in the second vaporization chamber is supplied to the second inner passage. That is, different amounts of liquefied gases can be supplied to the first and second vaporization chambers. Thus, the first and second inner passages can receive different quantities of gases.

In the handler of the aspect of the invention, the discharge channel may have a first discharge channel and a second discharge channel. The non-return valve may have a first non-return valve and a second non-return valve. The first discharge channel may be connected with the first inner passage. The first non-return valve may be included in the first discharge channel. The second discharge channel may be connected with the second inner passage. The second non-return valve corresponding to the other non-return valve may be included in the second discharge channel.

The handler of this configuration can prevent the flow of air containing a larger amount of water than that of the liquefied gas into the first inner passage and the first vaporization chamber through the first discharge channel during the stop of cooling for the stage, for example. Similarly, this handler can prevent the flow of air containing a larger amount of water than that of the liquefied gas into the second inner passage and the second vaporization chamber through the second discharge channel. Accordingly, dew condensation on the first and second inner passages and the first and second vaporization chambers can be avoided when cooling for the stage is restarted.

In the handler of the aspect of the invention, the second discharge channel may be connected with the first discharge channel. The first non-return valve may be included in the first discharge channel and disposed on the upstream side with respect to the connection point between the first and second discharge channels.

The handler of this configuration can prevent the flow of the gas discharged from the first inner passage into the second inner passage, and the flow of the gas discharged from the second inner passage into the first inner passage.

In the handler of the aspect of the invention, the first discharge channel may include a temperature raising unit disposed on the downstream side with respect to the connection point between the first and second discharge channels to raise the temperature of gas flowing through the first discharge channel.

The handler of this configuration can introduce the gas whose temperature has been raised by the temperature raising unit into the housing vessel. In this case, the temperature within the housing vessel becomes higher than that of the housing vessel which receives gas whose temperature has not been raised. Under this condition, the temperature within the housing vessel can be easily maintained at a higher temperature than the dew point. Accordingly, dew condensation within the housing vessel can be avoided.

In the handler of the aspect of the invention, a third non-return valve may be provided in the first discharge channel on the downstream side with respect to the temperature raising unit to regulate the flow of gas into the temperature raising unit.

The handler of this configuration can prevent the flow of air containing a larger amount of water than that of the liquefied gas into the temperature raising unit through the discharge channel during the stop of cooling for the stage, for example. Accordingly, dew condensation of water on the temperature raising unit can be avoided when cooling for the stage is restarted.

A part inspecting apparatus according to another aspect of the invention includes: a conveying robot which conveys a part; a stage on which the part is supported; a supply unit to which liquefied gas produced by liquification of gas is supplied; a supply channel which connects the supply unit and a passage within the stage; a valve which opens and closes the supply channel; a heater which heats the stage; a temperature sensor which detects the temperature of the stage; a controller which controls the output of the heater and opening and closing of the valve such that the temperature detected by the temperature sensor becomes a predetermined temperature; and a vaporization vessel included along the way to the supply channel and having a larger flow path cross-sectional area than the corresponding area of the supply channel to vaporize the liquefied gas; and a tester which inspects the part.

The part inspecting apparatus of this aspect of the invention can adjust the temperature of the stage to a predetermined temperature, and vaporize the liquefied gas in the vaporization vessel before the liquefied gas reaches the stage. Pressure fluctuations produced by this vaporization can be reduced within the vaporization vessel. Then, the gas vaporized in the vaporization vessel is supplied to the passage within the stage. Thus, excessive cooling for the stage caused by supplying heat required for vaporization of the liquefied gas can be prevented. Accordingly, pressure fluctuations and excessive cooling for the stage caused by vaporization of the liquefied gas can be reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
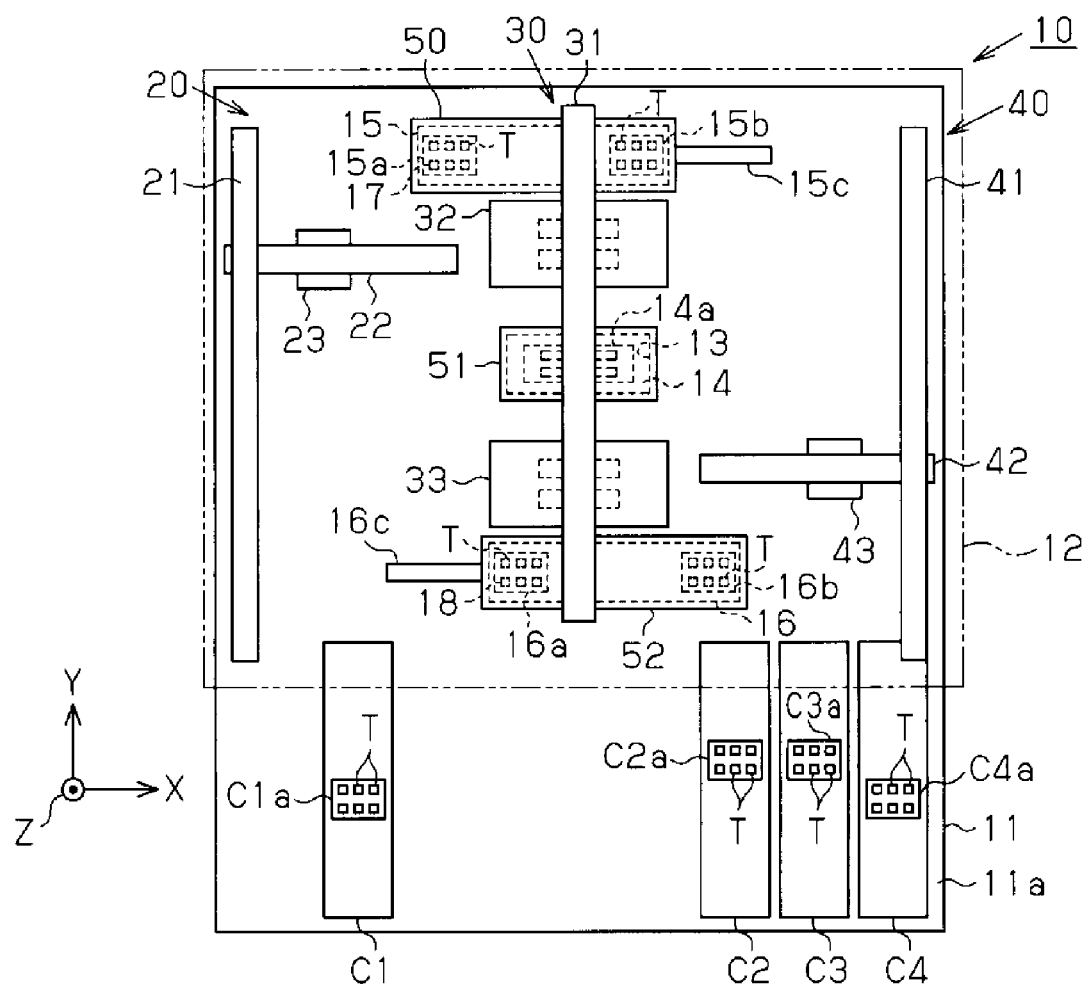
FIG. 1 illustrates the general structure of a handler and a part inspecting apparatus according to an embodiment of the invention.

A handler and a part inspecting apparatus according to an embodiment of the invention are hereinafter described with reference to FIGS. 1 through 3. The part inspecting apparatus includes a handler for conveying electronic parts, and a tester provided separately from the handler for inspecting the electric characteristics of the electronic parts.

Structures of the Handler and Part Inspecting Apparatus

The general structures of the handler and the part inspecting apparatus including the handler are initially explained with reference to FIG. 1. As illustrated in FIG. 1, a carrying surface 11a corresponding to the top surface of a base 11 of a handler 10 is provided as a surface on which various types of robots are mounted. The major area of the carrying surface 11a is covered by a cover member 12. A conveyance space surrounded by the cover member 12 and the carrying surface 11a receives dry air from the outside to maintain a predetermined humidity and temperature of the space.

Four conveyers C1 through C4 are arranged on the carrying surface 11a of the base 11 to convey electronic parts T between the outside and the inside of the cover member 12. The supplying conveyer C1 which conveys the electronic parts T before inspection from the outside to the inside of the cover member 12 is disposed on one side in an X direction corresponding to the direction where the respective conveyers are arranged. The receiving conveyers C2, C3, and C4 which convey the electronic parts T after inspection from the inside to the outside of the cover member 12 are disposed on the other side in the X direction. These conveyers C1 through C4 convey the plural electronic parts T contained in device trays C1a through C4a provided on the respective conveyers.

A rectangular opening 13 formed substantially at the center of the conveyance space is a hole penetrating the carrying surface 11a. A test head 14 of the tester is attached to the opening 13. An inspection socket 14a provided on the upper surface of the test head 14 to engage with the electronic parts T is electrically connected with an inspection circuit included in the tester for inspection of the attached electronic parts T. According to the structure of this tester, the test head 14 and the inspection socket 14a constitute one stage.

The carrying surface 11a carries a first shuttle 15 and a second shuttle 16 disposed on both sides of the opening 13 in a Y direction perpendicular to the X direction, on which the electronic parts T before and after inspection are temporarily placed. The shuttles 15 and 16 are extended in the X direction, and supplying shuttle plates 15a and 16a are, respectively, fixed to the upper surfaces of the shuttles 15 and 16 on the side near the supplying conveyer C1. The supplying shuttle plates 15a and 16a have a plurality of housing pockets 17 and 18, respectively, within which the electronic parts T prior to inspection are housed. On the other hand, receiving shuttle plates 15b and 16b are fixed to the upper surfaces of the shuttles 15 and 16 on the side near the receiving conveyers C2 through C4, within which plates 15b and 16b the electronic parts T after inspection are housed. The shuttles 15 and 16 are, respectively, connected with shuttle guides 15c and 16c fixed to the carrying surface 11a and extended in the X direction so as to provide reciprocating movement in the X direction. According to the structure of the handler 10, the first shuttle 15 and the supplying shuttle plate 15a constitute one stage, while the second shuttle 16 and the supplying shuttle plate 16a constitute another stage.

The carrying surface 11a of the base 11 further carries a robot mechanism which conveys the electronic parts T to each of the inspection socket 14a, the supplying shuttle plates 15a and 16a, and the receiving shuttle plates 15b and 16b. The shuttles 15 and 16 shift along the shuttle guides 15c and 16c in accordance with the actions of a supplying robot 20, a conveying robot 30, and a receiving robot 40 constituting the robot mechanism.

The supplying robot 20 disposed on the Y side of the supplying conveyer C1 conveys the electronic parts T prior to inspection from the device tray C1a on the supplying conveyer C1 to the supplying shuttle plates 15a and 16a on the shuttles 15 and 16. More specifically, the supplying robot 20 has a supplying side fixed guide 21 as a fixed shaft extended in the Y direction, a supplying side movable guide 22 connected with the supplying side fixed guide 21 in such a manner as to be reciprocally movable in the Y direction, and a supplying hand unit 23 connected with the supplying side movable guide 22 in such a manner as to be reciprocally movable in the X direction. A suction portion is provided at the lower end of the supplying hand unit 23 to suck (vacuum hold) the electronic parts T. The supplying hand unit 23 is joined to the supplying side movable guide 22 in such a manner as to be movable downward and upward in the direction of coming close to and away from the carrying surface 11a. The electronic parts T placed on the device tray C1a are sucked to the suction portion of the supplying hand unit 23 and conveyed in accordance with shifts of the supplying side movable guide 22 and the supplying hand unit 23 to be placed on the supplying shuttle plates 15a and 16a.

The receiving robot 40 disposed on the Y side of the receiving conveyers C2 through C4 conveys the electronic parts T after inspection from the receiving shuttle plates 15b and 16b on the shuttles 15 and 16 to the device trays C2a through C4a on the receiving conveyers C2 through C4. More specifically, the receiving robot 40 has a receiving side fixed guide 41 as a fixed shaft extended in the Y direction, a receiving side movable guide 42 connected with the receiving side fixed guide 41 in such a manner as to be reciprocally movable in the Y direction, and a receiving hand unit 43 connected with the receiving side movable guide 42 in such a manner as to be reciprocally movable in the X direction similarly to the supplying robot 20. A suction portion is provided at the lower end of the receiving hand unit 43 to suck the electronic parts T. The receiving hand unit 43 is joined to the receiving side movable guide 42 in such a manner as to be movable downward and upward in the direction of coming close to and away from the carrying surface 11a. The electronic parts T placed on the receiving shuttle plates 15b and 16b are sucked to the suction portion of the receiving hand unit 43 and conveyed in accordance with shifts of the receiving side movable guide 42 and the receiving hand unit 43 to be placed on the device trays C2a through C4a.

The conveying robot 30 has a conveying guide 31 as a fixed shaft disposed substantially at the center of the conveyance space and extended in the Y direction, and a first conveying unit 32 and a second conveying unit 33 connected with the conveying guide 31 in such a manner as to be reciprocally movable in the Y direction. The first conveying unit 32 reciprocates above and between the first shuttle 15 and the test head 14, while the second conveying unit 33 reciprocates above and between the second shuttle 16 and the test head 14. A suction portion is provided at each lower end of the first conveying unit 32 and the second conveying unit 33 to suck the electronic parts T. The first conveying unit 32 and the second conveying unit 33 are connected with the conveying guide 31 in such a manner as to be movable downward and upward in the direction of coming close to and away from the carrying surface 11a.

The first conveying unit 32 sucks the electronic parts T prior to inspection placed on the supplying shuttle plate 15a on the first shuttle 15 via the suction portion of the first conveying unit 32, and conveys and brings the electronic parts T into engagement with the inspection socket 14a of the test head 14 by a predetermined pressing force. A plurality of female terminals are concaved in the bottom surface of the inspection socket 14a to engage with male terminals of the electronic parts T. When the male terminals of the electronic parts T and the female terminals of the inspection socket 14a are engaged, the tester can carry out inspection of the electric characteristics of the electronic parts T. The tester initiates inspection of the electronic parts T in response to an instruction of inspection start received from the handler 10, and outputs the inspection result and a signal indicating the end of inspection to the handler 10. When the inspection of the electronic parts T ends, the first conveying unit 32 conveys the electronic parts T after inspection from the inspection socket 14a of the test head 14 to the receiving shuttle plate 15b on the first shuttle 15.

Similarly, the second conveying unit 33 sucks the electronic parts T prior to inspection placed on the supplying shuttle plate 16a on the second shuttle 16 via the suction portion of the second conveying unit 33, and conveys and brings the electronic parts T into engagement with the inspection socket 14a of the test head 14 by a predetermined pressing force. When the tester finishes inspection of the electronic parts T, the second conveying unit 33 conveys the electronic parts T after inspection from the inspection socket 14a of the test head 14 to the receiving shuttle plate 16b on the second shuttle 16. The actions of the first conveying unit 32 and the second conveying unit 33 for conveying the electronic parts T toward the test head 14 in this manner are alternately carried out so that the tester can sequentially execute inspection of the electronic parts T.

Each of the supplying hand unit 23, the receiving hand unit 43, and the first and second conveying units 32 and 33 simultaneously sucks and holds a plurality of electronic parts. Each of the suction portions of the respective units 23, 43, 32, and 33 is provided as an end effector capable of sucking and holding the electronic parts T by vacuum suction, for example.

According to this embodiment, a housing box 50 is provided around the first shuttle 15 as a housing vessel which has an isolated chamber within the conveyance space to contain the first shuttle 15, the supplying shuttle plate 15a, and the receiving shuttle plate 15b. Similarly, an inspection box 51 is provided around the opening 13 and the test head 14 attached to the opening 13 as a housing vessel which has an isolated chamber within the conveyance space to contain the test head 14 and the inspection socket 14a. Furthermore, a housing box 52 is provided around the second shuttle 16 as a housing vessel which has an isolated chamber within the conveyance space to contain the second shuttle 16, the supplying shuttle plate 16a, and the receiving shuttle plate 16b. Cooling for the electronic parts T is carried out for each of the housing box 50, the inspection box 51, and the housing box 52.

Structure of Cooling Unit

The structure of a cooling unit for cooling the electronic parts T is now explained with reference to FIG. 2. The part inspecting apparatus includes cooling units for cooling the electronic parts T contained in the housing pockets 17 and 18 of the supplying shuttle plates 15a and 16a, and a cooling unit for cooling the electronic parts T contained in the inspection socket 14a of the test head 14. In this embodiment, the cooling unit for cooling the electronic parts T contained in the housing pockets 17 on the supplying shuttle plate 15a is discussed as an example.

Figure 2:
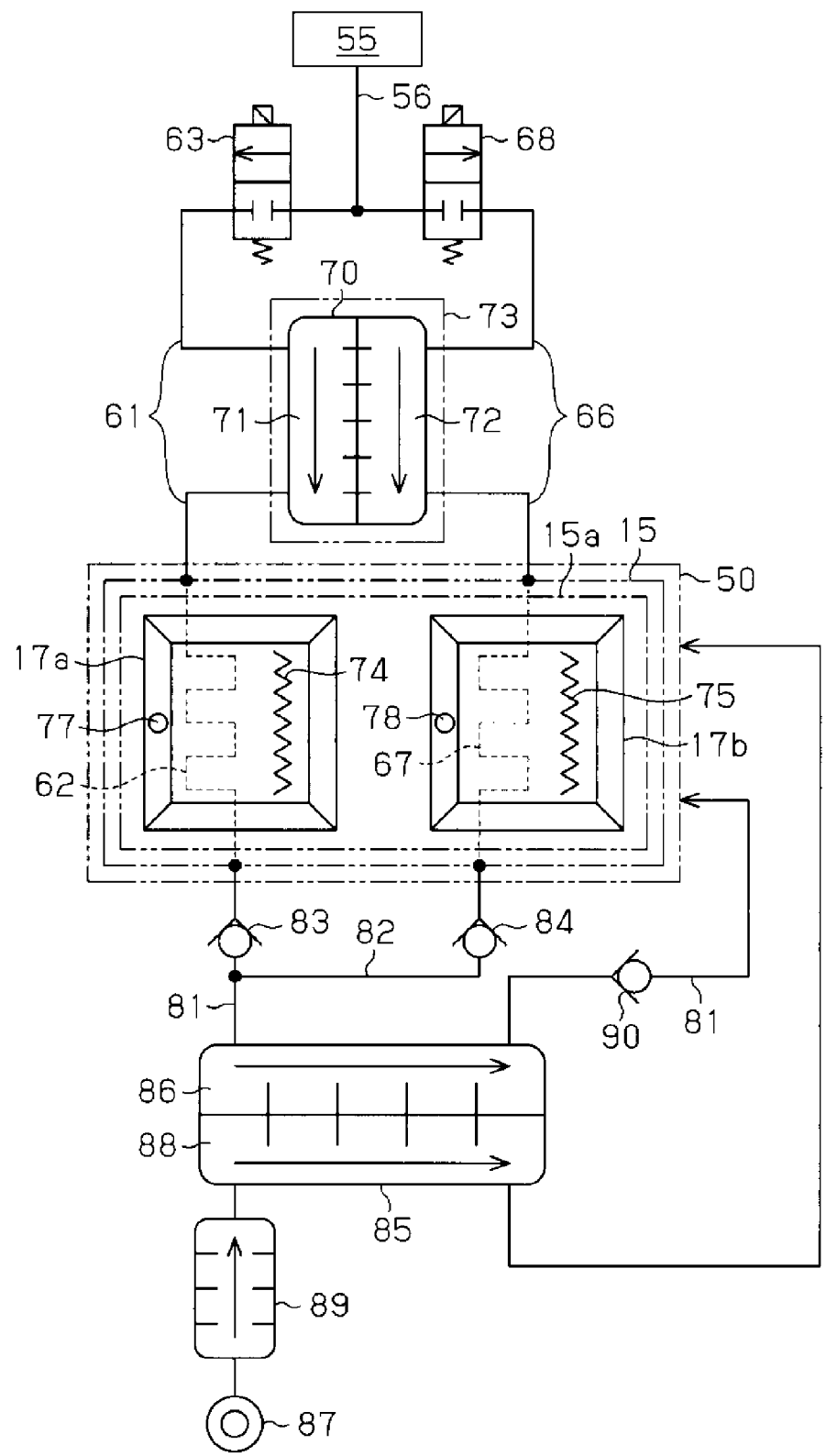
FIG. 2 schematically illustrates the general structure of a cooling unit according to the embodiment.

As illustrated in FIG. 2, one cooling unit cools the electronic parts T contained in two housing pockets 17a and 17b of the plural housing pockets 17 included in the supplying shuttle plate 15a. The cooling unit uses nitrogen gas produced by vaporization of liquid nitrogen as liquefied gas to decrease the temperatures of the housing pockets 17a and 17b on the supplying shuttle plate 15a to a target temperature of −45° C., for example.

According to the structure of the cooling unit, a first supply channel 61 is connected via a common channel 56 to a storage tank 55 as a supply unit storing liquid nitrogen. The first supply channel 61 is a pipe having a continuous and substantially uniform cross-sectional area of the flow path, and connected with a first inner passage 62 included in the first shuttle 15 positioned so as to pass immediately below the housing pocket 17a. A first valve 63 (hereinafter abbreviated as a valve 63) is included in the first supply channel 61 to control the supply amount of liquid nitrogen to a first vaporization chamber 71 by opening and closing the first supply channel 61.

Similarly, a second supply channel 66 is connected via a common channel 56 to the storage tank 55. The second supply channel 66 is a pipe having substantially the same cross-sectional area of the flow path as that of the first supply channel 61, and connected with a second inner passage 67 included in the first shuttle 15 positioned so as to pass immediately below the housing pocket 17b. A second valve 68 (hereinafter abbreviated as a valve 68) is included in the second channel 66 to control the supply amount of liquid nitrogen to a second vaporization chamber 72 by opening and closing the second supply channel 66.

A heat exchanger 70 is included along the first and second supply channels 61 and 66. The heat exchanger 70 is a so-called plate-type heat exchanger disposed on the downstream side with respect to the respective valves 63 and 68, and covered with a heat insulator 73. The first and second supply channels 61 and 66 are coupled with the heat exchanger 70 in such a manner that the flow of the respective channels 61 and 66 becomes parallel in the heat exchanger 70. The first supply channel 61 is connected with the first vaporization chamber 71, while the second supply channel 66 is connected with the second vaporization chamber 72. The first and second vaporization chambers 71 and 72 have larger flow path cross-sectional areas than those of the first and second supply channels 61 and 66, respectively, and therefore have larger flow path areas and volumes than those of the first and second supply channels 61 and 66. Liquid nitrogen flowing into the first and second vaporization chambers 71 and 72 is exposed to the interior of the heat exchanger 70 having a higher temperature than the boiling point of liquid nitrogen, and therefore flows out of the heat exchanger 70 as nitrogen gas having a lower temperature than the target temperature. Therefore, the heat exchanger 70 is not a unit which expands refrigerant to lower the temperature of the refrigerant or allows refrigerant to positively absorb heat around the heat exchanger 70, but functions as a vaporizing vessel for vaporizing liquid nitrogen. The low-temperature nitrogen gas vaporized within the heat exchanger 70 flows into the first and second inner passages 62 and 67 formed in the first shuttle 15 to cool the housing pockets 17a and 17b on the supplying shuttle plate 15a.

Moreover, heating units 74 and 75 (hereinafter abbreviated as heaters 74 and 75) are provided within the first shuttle 15 immediately below the respective housing pockets 17a and 17b provided on the supplying shuttle plate 15a. The heaters 74 and 75 heat the housing pockets 17a and 17b. Temperature sensors 77 and 78 for detecting the temperatures of the housing pockets 17a and 17b are provided on the housing pockets 17a and 17b. The temperatures of the housing pockets 17a and 17b are adjusted to the target temperature by both cooling by the nitrogen gas flowing through the inner passages 62 and 67 and heating by the heaters 74 and 75.

On the other hand, a first discharge channel 81 is connected with a discharge port of the first inner passage 62. The first discharge channel 81 is further connected with the housing box 50 to receive the nitrogen gas discharged from the first inner passage 62 into the housing box 50. Moreover, a second discharge channel 82 is connected with a discharge port of the second inner passage 67. The second discharge channel 82 is further connected with the first discharge channel 81 to receive the nitrogen gas discharged from the second inner passage 67 into the first discharge channel 81. Thus, the nitrogen gas discharged from both the first and second inner passages 62 and 67 is introduced into the housing box 50.

A first non-return valve 83 for regulating flow of gas from the first inner passage 62 is included in the first discharge channel 81 on the upstream side with respect to the connection point between the first and second discharge channels 81 and 82. Similarly, a second non-return valve 84 for regulating flow of gas from the second inner passage 67 is included in the second discharge channel 82.

Furthermore, a heat exchanger 85 as a temperature raising unit for raising the temperature of nitrogen gas flowing through the first discharge channel 81 to a temperature around room temperature is included along the first discharge channel 81 on the downstream side with respect to the connection point between the first discharge channel 81 and the second discharge channel 82. The heat exchanger 85 is a so-called plate-type heat exchanger which allows nitrogen gas flowing through the first discharge channel 81 to flow into a low-temperature fluid chamber 86, and allows dry air produced by a dry air supply source 87 to flow into a high-temperature fluid chamber 88. The nitrogen gas and dry air flow within the heat exchanger 85 in such a manner as to become parallel flow. The dry air supply source 87 is constituted by a compressor or a drier. The temperature of the dry air produced by the dry air supply source 87 is raised to a temperature higher than room temperature by the use of an air heater 89. Then, the temperature of the dry air is lowered to a temperature around room temperature by heat exchange with the nitrogen gas introduced from the first discharge channel 81 into the heat exchanger 85, thereafter the dry air is guided into the housing box 50. A third non-return valve 90 for regulating flow of gas into the low-temperature fluid chamber 86 is included in the first discharge channel 81 on the downstream side with respect to the heat exchanger 85.

Electric Structures of the Handler and Part Inspecting Apparatus

The electric structures of the handler and the part inspecting apparatus are now explained with reference to FIG. 3. In the following description, the electric structure of the handler 10 is chiefly discussed. A control device 95 constituting a controller of the handler 10 has a microcomputer as a main device which includes a central processing unit (CPU), a non-volatile memory (ROM), and a volatile memory (RAM). The control device 95 performs and supervises various controls associated with the handler 10 such as the actions of the robot mechanism including the supplying robot 20, the conveying robot 30, and the receiving robot 40 based on various data and programs stored in the ROM and RAM. The control device 95 electrically connects with a tester 98 to allow input and output of signals requesting the start and end of inspection of the electronic parts T from and to the tester 98. Explained herein is a control mode associated with the cooling unit corresponding to the housing pockets 17a and 17b of the supplying shuttle plate 15a as an example of the controls performed by the control device 95.

Figure 3:
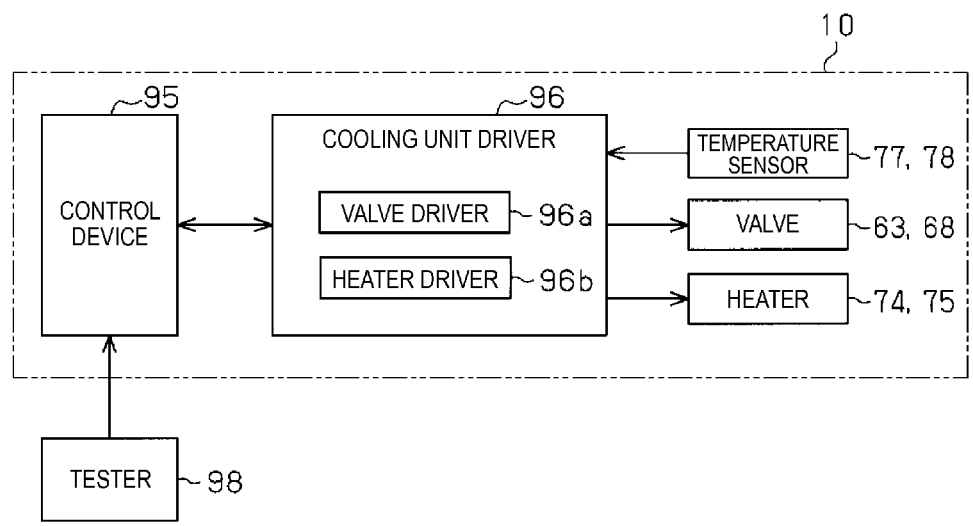
FIG. 3 is a block diagram showing a part of the electric structure of the handler according to the embodiment.

As illustrated in FIG. 3, a cooling unit driver 96 provided with a valve driver 96a and a heater driver 96b is electrically connected with the control device 95. The valve driver 96a determines the opening and closing time for each of the valves 63 and 68 such that the temperatures of the housing pockets 17a and 17b on the supplying shuttle plate 15a become the target temperature based on the target temperature received from the control device 95 and the temperatures received from the temperature sensors 77 and 78, and also outputs a signal indicating the opening and closing time to each of the valves 63 and 68. The valves 63 and 68 open and close in accordance with the inputted signal to control the supply amount of nitrogen gas to each of the first and second inner passages 62 and 67.

The heater driver 96b produces driving power for each of the heaters 74 and 75 such that the temperatures of the housing pockets 17a and 17b become the target temperature based on the target temperature received from the control device 95 and the temperatures received from the temperature sensors 77 and 78, and outputs the driving powers to the heaters 74 and 75 to drive the heaters 74 and 75.

Similarly to the cooling unit driver 96, a cooling unit driver is equipped for each of the cooling units corresponding to the other housing pockets 17 on the supplying shuttle plate 15a, the housing pockets 18 on the supplying shuttle plate 16a, and the inspection socket 14a of the test head 14. Thus, the control device 95 separately controls the respective cooling units.

Operation

The operations of the handler and the part inspecting apparatus according to this embodiment are now explained.

According to the handler and the part inspecting apparatus in this embodiment, liquid nitrogen supplied from the storage tank 55 to the first supply channel 61 in the cooling unit flows into the first vaporization chamber 71 of the heat exchanger 70 in the course of flow. The cross-sectional area of the flow path of the first vaporization chamber 71 is larger than the area of the inside flow path of the first supply channel 61. Thus, the contact area between the liquid nitrogen flowing into the first vaporization chamber 71 and the component having a higher temperature than the boiling point of liquid nitrogen increases, promoting transition from liquid nitrogen into nitrogen gas. The nitrogen gas thus produced flows into the first inner passage 62 to cool the housing pocket 17a, and then enters the first discharge channel 81 for discharge.

Similarly, liquid nitrogen supplied from the storage tank 55 to the second supply channel 66 flows into the second vaporization chamber 72 of the heat exchanger 70 and changes into nitrogen gas. The nitrogen gas thus generated flows into the second inner passage 67 to cool the surroundings of the housing pocket 17b, and passes through the second discharge channel 82 to enter the first discharge channel 81.

Then, the control device 95 controls the supply amounts of nitrogen gas supplied to the respective inner passages 62 and 67, and the driving power outputted to the heaters 74 and 75 such that the temperatures received from the temperature sensors 77 and 78 become the target temperature (i.e., feedback control). Under this control, the temperatures of the electronic parts T contained in the respective housing pockets 17a and 17b are adjusted to a desired temperature (e.g., the target temperature).

According to the series of processes noted above, the respective vaporization chambers 71 and 72 are filled with nitrogen gas produced by preceding vaporization of liquid nitrogen, and have larger volumes than those of the first and second supply channels 61 and 66. In this case, even when the pressure fluctuates by succeeding vaporization of liquid nitrogen, these pressure fluctuations can be reduced in the respective vaporization chambers 71 and 72.

Moreover, by the process of vaporization of liquid nitrogen at the heat exchanger 70, the inner passages 62 and 67 do not receive flow of liquid nitrogen but rather receive flow of nitrogen gas. In this case, excessive cooling for a part of the housing pockets 17a and 17b caused by vaporization of liquid nitrogen within the inner passages 62 and 67 can be avoided.

The nitrogen gas discharged from the first and second inner passages 62 and 67 into the first discharge channel 81 flows into the low-temperature fluid chamber 86 of the heat exchanger 85. On the other hand, dry air whose temperature has been raised to a temperature higher than room temperature by the air heater 89 flows into the high-temperature fluid chamber 88 of the heat exchanger 85. The nitrogen gas is subjected to heat exchange with the dry air at the heat exchanger 85 to increase the temperature of the nitrogen gas to a temperature around room temperature, and is introduced into the housing box 50. On the other hand, the temperature of the dry air is decreased to a temperature around room temperature by heat exchange with the nitrogen gas, and introduced into the housing box 50.

The nitrogen gas is produced from vaporized liquid nitrogen, and thus contains virtually no water. Similarly, the dry air contains a smaller quantity of water than that of air around the handler. Therefore, the housing box 50 having received the nitrogen gas and dry air is filled with gas containing only a small amount of water. In this case, dew condensation within the housing box 50 can be reduced. Accordingly, failures of the electronic parts T caused by dew condensation on the supplying shuttle plate 15*a* and the electronic parts T contained in the supplying shuttle plate 15*a* can be avoided.

Moreover, nitrogen gas whose temperature has been raised to a temperature around room temperature by the use of the heat exchanger 85 is introduced into the housing box 50. In this case, the temperature of the interior of the housing box 50 can be maintained at a temperature higher than the dew point more easily than a structure which introduces nitrogen gas discharged from the respective inner passages 62 and 67 into the housing box 50 without raising the temperature of the nitrogen gas. Accordingly, failures of the electronic parts T caused by dew condensation on the receiving shuttle plate 15*b* and the electronic parts T contained in the receiving shuttle plate 15*b* as well as dew condensation on the supplying shuttle plate 15*a* and the electronic parts T contained in the supplying shuttle plate 15*a* can be reduced.

Furthermore, the nitrogen gas for cooling the supplying shuttle plate 15*a* and the dry air for raising the temperature of the nitrogen gas to a temperature around room temperature are used as gases for preventing dew condensation on the housing box 50. Thus, simplification of the structure of the cooling unit and reduction of the quantity of gas to be used can both be achieved when compared with a structure which prepares gas dedicated for dew condensation prevention in addition to these gases.

The respective valves 63 and 68 are disposed on the upstream side with respect to the heat exchanger 70 which vaporizes liquid nitrogen. When the valve 63 is kept closed in a structure which positions the valve 63 on the downstream side with respect to the heat exchanger 70 in the first supply channel 61, the first vaporization chamber 71 of the heat exchanger 70 located between the storage tank 55 and the valve 63 is also closed. In this case, it is expected that the pressure within the first vaporization chamber 71 increases as a result of vaporization of a part of liquid nitrogen. Thus, the heat exchanger 70 is required to have pressure resistance sufficient for enduring the raised pressure. On the other hand, the valve according to this embodiment is disposed on the upstream side with respect to the heat exchanger 70 in the supply channel. In this case, when liquid nitrogen remaining on the downstream side with respect to the valve 63 in a closed condition is vaporized, a part of the vaporized nitrogen gas is introduced into the housing box 50 via the first inner passage 62 and the first discharge channel 81. Accordingly, the level of pressure resistance required for the heat exchanger 70 can become lower than the level required when the valve is positioned on the downstream side with respect to the heat exchanger 70.

Moreover, the first non-return valve 83 is included in the first discharge channel 81 on the upstream side with respect to the connection point between the first and second discharge channels 81 and 82. In addition, the second non-return valve 84 is included in the second discharge channel 82 on the downstream side with respect to the second inner passage 67. This structure can prevent flow of nitrogen gas discharged from the first inner passage 62 into the second inner passage 67 through the second discharge channel 82, and flow of nitrogen gas discharged from the second inner passage 67 into the first inner passage 62 through the first discharge channel 81. In this case, the housing pockets 17*a* and 17*b* are cooled only by using the nitrogen gas supplied to the respective inner passages 62 and 67. Thus, cooling for the housing pockets 17*a* and 17*b* can be carried out with higher accuracy.

Furthermore, the third non-return valve 90 is included in the first discharge channel 81 on the downstream side with respect to the heat exchanger 85. In this case, air containing a larger amount of water than that of nitrogen gas or dry air does not flow from the housing box 50 into the heat exchanger 85, the first and second inner passages 62 and 67, and the heat exchanger 70 through the first discharge channel the valves 63 and 68 are closed. Accordingly, dew condensation on the heat exchanger 85, the first and second inner passages 62 and 67, and the heat exchanger 70 can be prevented when the valves 63 and 68 are re-opened.

The heat exchanger 70 can achieve vaporization of liquid nitrogen, and heat exchange between nitrogen gas within the first vaporization chamber 71 and nitrogen gas within the second vaporization chamber 72. In this case, under the open condition of the valve 63 and the close condition of the valve 68, for example, nitrogen gas remaining within the second vaporization chamber 72 can be cooled by the nitrogen gas flowing through the first vaporization chamber 71. In this case, the nitrogen gas whose temperature has been kept low is immediately supplied to the second inner passage 67 when the valve 68 in the closed condition is re-opened. Thus, the time required for decreasing the temperature of the housing pocket 17*b* to the target temperature can be shortened.

The heat exchanger 70 is covered with the heat insulator 73. In this case, the temperature of the nitrogen gas within the heat exchanger 70 can be easily maintained at a low temperature. Accordingly, thermal loss produced when the nitrogen gas is supplied for cooling the first and second inner passages 62 and 67 can be reduced.

The handler and the part inspecting apparatus according to the embodiment described herein can offer the following advantages.

(1) The respective vaporization chambers 71 and 72 of the heat exchanger 70 have larger flow path cross-sectional areas than those of the first and second supply channels 61 and 66, respectively, and therefore have larger inner flow path areas and volumes than those of the first and second supply channels 61 and 66. Accordingly, liquid nitrogen can be vaporized within the respective vaporization chambers 71 and 72, and pressure fluctuations produced by this vaporization can be reduced in the respective vaporization chambers 71 and 72.

(2) Moreover, the vaporization of liquid nitrogen which takes place within the respective vaporization chambers 71 and 72 of the heat exchanger 70 can avoid excessive cooling for the housing pockets 17*a* and 17*b*.

(3) The valves 63 and 68 are disposed on the upstream side with respect to the heat exchanger 70. Thus, the level of pressure resistance required for the heat exchanger 70 can be decreased lower than the level of pressure resistance required for a structure which disposes the valves 63 and 68 on the downstream side with respect to the heat exchanger 70.

(4) Nitrogen gas used for cooling the housing pockets 17*a* and 17*b* is introduced into the housing box 50. In this case, the amount of water contained in the gas accommodated in the housing box 50 decreases. Accordingly, failures of the electronic parts T caused by dew condensation on the supplying shuttle plate 15a and the electronic parts T contained in the supplying shuttle plate 15a can be prevented.

(5) The supply amounts of liquid nitrogen for the first and second vaporization chambers 71 and 72 are controlled by the valves 63 and 68, respectively. Thus, different amounts of nitrogen gas can be supplied to the first and second inner passages 62 and 67.

(6) The first and second non-return valves 83 and 84 are included in the first and second discharge channels 81 and 82. This structure prevents air containing a larger amount of water than that of nitrogen gas from flowing into the first and second inner passages 62 and 67 and the heat exchanger 70 through the first and second discharge channels 81 and 82. Accordingly, dew condensation on the heat exchanger 85, the first and second inner passages 62 and 67, and the heat exchanger 70 can be reduced.

(7) The first non-return valve 83 is included in the first discharge channel 81 on the upstream side with respect to the connection point between the first and second discharge channels 81 and 82, while the second non-return valve 84 is included in the second discharge channel 82. This structure can prevent the flow of nitrogen gas from the first inner passage 62 to the second inner passage 67 through the second discharge channel 82, and the flow of nitrogen gas from the second inner passage 67 to the first inner passage 62 through the first discharge channel 81.

(8) The second discharge channel 82 is connected with the first discharge channel 81. Thus, the structure of the discharge channels can be simplified when compared with a structure which connects the first and second discharge channels 81 and 82 with the housing box 50 as separate channels.

(9) The heat exchanger 85 is included in the first discharge channel 81 to increase the temperature of the nitrogen gas discharged from the first and second inner passages 62 and 67 to a temperature around room temperature. In this case, the temperature of the interior of the housing box 50 can be easily maintained at a higher temperature than the dew point. Accordingly, failures of the electronic parts T caused by dew condensation on the receiving shuttle plate 15b and the electronic parts T contained in the receiving shuttle plate 15b can be prevented.

(10) Nitrogen gas for cooling the supplying shuttle plate 15a and dry air for raising the temperature of the nitrogen gas to a temperature around room temperature are used as gas for avoiding dew condensation on the housing box 50. This structure reduces the amount of gas to be used for the prevention of dew condensation on the housing box 50.

(11) The third non-return valve 90 is disposed on the downstream side with respect to the heat exchanger 85. In this case, when the valves 63 and 68 are closed, air containing a larger amount of water than that of nitrogen gas does not flow into the heat exchanger 85, the first and second inner passages 62 and 67, and the heat exchanger 70. Accordingly, dew condensation on the heat exchanger 85, the first and second inner passages 62 and 67, and the heat exchanger 70 can be avoided.

(12) The vaporization vessel provided with the first and second vaporization chambers 71 and 72 is constituted by the heat exchanger 70. In this case, under the open condition of the valve 63 and the close condition of the valve 68, for example, nitrogen gas remaining within the second vaporization chamber 72 can be kept at a low temperature by heat exchange with the nitrogen gas flowing through the first vaporization chamber 71. Accordingly, the time required for decreasing the temperature of the housing pocket 17b to the target temperature when the valve 68 in the closed condition is again opened can be shortened.

(13) The heat exchanger 70 is covered with the heat insulator 73. Accordingly, thermal loss produced when cooling nitrogen gas is supplied to the first and second inner passages 62 and 67 can be reduced.

(14) The heat exchanger 85 is disposed on the downstream side with respect to the connection point between the first discharge channel 81 and the second discharge channel 82. Thus, the number of the heat exchangers can be smaller than the number required for a structure which includes a heat exchanger 85 for each of the first and second discharge channels 81 and 82.

(15) Nitrogen gas and dry air flow in parallel with each other in the heat exchanger 85. This structure can decrease the temperature difference between nitrogen gas and dry air immediately after their passing through the heat exchanger 85 when compared with a structure which allows nitrogen gas and dry air to flow opposed to each other in the heat exchanger 85. Thus, the temperature distribution of the housing box 50 receiving the nitrogen gas and the dry air can be equalized.

According to this embodiment, the following modifications may be made where appropriate.

The third non-return valve 90 included in the first discharge channel 81 may be eliminated. In this case, the flow of air into the first and second inner passages 62 and 67 and the heat exchanger 70 through the first discharge channel 81 can be similarly prevented by the functions of the first non-return valve 83 in the first discharge channel 81 and the second non-return valve 84 in the second discharge channel 82.

The heat exchanger 85 for increasing the temperature of nitrogen gas discharged from the first and second inner passages 62 and 67 may be eliminated. In this case, the temperature of the interior of the housing box 50 decreases, but dew condensation on the housing box 50 can be avoided by introduction of the nitrogen gas containing virtually no water into the housing box 50.

The temperature of the nitrogen gas discharged from the first and second inner passages 62 and 67 may be increased by an air heater or the like in place of the heat exchanger 85.

The first and second discharge channels 81 and 82 may be separately connected to the housing box 50. In this case, it is preferable that the heat exchanger 85 and the third non-return valve 90 are provided for each of the first and second discharge channels 81 and 82.

The dry air flowing out of the high-temperature fluid chamber 88 of the heat exchanger 85 may be discharged into the cover member 12 or into the atmosphere.

At least one of the first non-return valve 83 in the first discharge channel 81 and the second non-return valve 84 in the second discharge channel 82 may be eliminated. In other words, at least one of the first and second inner passages 62 and 67 may constantly communicate with the housing box 50.

Nitrogen gas flowing out of the vaporization vessel may flow into only one inner passage in one cooling unit. In this case, only one vaporization chamber is needed for the vaporization vessel. Alternatively, nitrogen gas flowing out of the vaporization vessel may flow into three or more inner passages in one cooling unit. In other words, three or more inner passages may be connected with the vaporization vessel in parallel. In this case, the vaporization vessel only requires vaporization chambers corresponding to the respective inner passages.

A plurality of inner passages may be connected to one supply channel in series in one cooling unit.

The first inner passage 62 and the second inner passage 67 may be included in different stages. In this case, when the second inner passage 67 is included in the second shuttle 16, for example, it is preferable that the nitrogen gas discharged from the second inner passage 67 is introduced into the housing box 52.

The nitrogen gas discharged from the first and second inner passages 62 and 67 may flow into the atmosphere instead of into the housing box 50.

The housing boxes 50 and 52 and the inspection box 51 of the handler 10 may be eliminated. In this case, the first and second discharge channels 81 and 82 may be connected with the cover member 12.

The valves 63 and 68 may be disposed on the downstream side with respect to the heat exchanger 70. In this case, the supply amount of nitrogen gas to the first and second inner passages 62 and 67 can be similarly controlled.

The inner passages are not required to be disposed within the stage exactly as shown. For example, the inner passages may be located within the supplying shuttle plate 15a instead of the first shuttle 15, or may be provided in both the first shuttle 15 and the supplying shuttle plate 15a.

The storage tank 55 may be provided outside the handler 10. In this case, a connection portion formed in the common channel 56 of the handler 10 to connect with piping joined with the storage tank 55 functions as a supply unit.

Liquefied gas is not limited to liquid nitrogen but may be liquid oxygen, liquid hydrogen, liquid helium or others.

Figure 4:
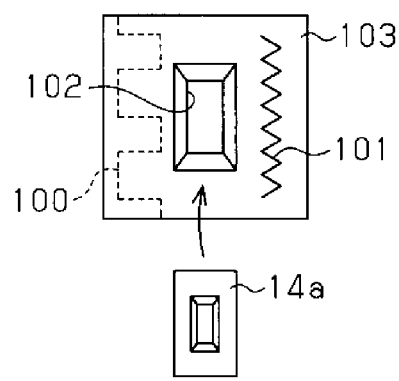
FIG. 4 schematically illustrates a stage according to a modified example.

According to this embodiment, the stage is constituted by the test head 14 attached to the opening 13 penetrating the base 11, and the inspection socket 14a provided on the upper surface of the test head 14. However, as illustrated in FIG. 4, the stage may be constituted by a pedestal 103 disposed on the base 11 and including an inner passage 100 through which nitrogen gas flows, a heating unit 101, and a housing portion 102 accommodating the inspection socket 14a. In this case, the inspection socket 14a is mounted on the handler 10 when accommodated in the housing portion 102 of the pedestal 103. According to this structure, the electronic parts contained in the inspection socket 14a can be cooled by cooling the pedestal 103.

The handler and the tester included in the part inspecting apparatus are separate units. Thus, when the test head 14 and the inspection socket 14a constitute a stage, the test head 14 of the tester requires a channel for flow of nitrogen gas and a heater beforehand separately from the structure of the handler. According to the structure described herein, however, the electronic parts T contained in the inspection socket 14a can be cooled without the use of the test head 14 provided with the inner passage and the heater.

The temperature sensor may be mounted either on the pedestal 103 or on the inspection socket 14a as long as the temperature sensor can detect the temperature of the stage. According to the example shown in FIG. 4, the pedestal 103 has the one housing portion 102. However, the number of the housing portion 102 may be two or a larger number. The test head 14 and the inspection socket 14a may be contained in the housing portion 102 of the pedestal 103. In short, the structure may cool a component in indirect contact with the electronic parts with a heat conductive member provided between the electronic parts and this component which corresponds to a stage for supporting the electronic parts.

The stage may be arbitrarily selected as long as the stage is a member disposed on the carrying surface 11a of the base 11 or at a position above the base 11 within the conveyance space covered by the cover member 12 to support the electronic parts T. For example, the supplying shuttle plate 15a and the receiving shuttle plate 15b may be determined as separate stages, for each of which stages a cooling unit is provided to cool the corresponding stage. Alternatively, a stage may be provided on the suction portion at the lower end of each of the first conveying unit 32 and the second conveying unit 33, and a cooling unit may be equipped at the lower end of each of the first conveying unit 32 and the second conveying unit 33. In other words, a cooling unit may be provided for a stage formed at any portion for supporting the electronic parts T. In this case, transfer of the electronic parts T between the respective cooling units is achieved through partial opening and closing of each housing vessel.

The entire disclosure of Japanese Patent Application No. 2012-029178 filed Feb. 14, 2012 is expressly incorporated herein by reference.

What is claimed is:

1. A handler, comprising:
a stage on which a part is supported;
a supply unit to which liquefied gas produced by liquification of gas is supplied;
a supply channel which connects the supply unit and a passage within the stage;
a valve which opens and closes the supply channel;
a heater which heats the stage;
a temperature sensor which detects a temperature of the stage;
a controller which controls an output of the heater and opening and closing of the valve such that the temperature detected by the temperature sensor becomes a predetermined temperature; and
a vaporization vessel included along the supply channel and having a larger flow path cross-sectional area than a flow path cross-sectional area of the supply channel to vaporize the liquefied gas.

2. The handler according to claim 1, wherein the valve is provided along the supply channel on the upstream side of the vaporization vessel.

3. The handler according to claim 1, further comprising:
a housing vessel which houses the stage; and
a discharge channel which connects the passage within the stage and an interior of the housing vessel.

4. The handler according to claim 3, wherein a non-return valve which regulates gas flow of into the passage within the stage is provided along the discharge channel.

5. The handler according to claim 4, wherein:
the passage has a first inner passage and a second inner passage;
the vaporization vessel has a first vaporization chamber and a second vaporization chamber;
the first inner passage communicates with the first vaporization chamber; and
the second inner passage communicates with the second vaporization chamber.

6. The handler according to claim 5, wherein:
the discharge channel has a first discharge channel and a second discharge channel;
the non-return valve has a first non-return valve and a second non-return valve;
the first discharge channel communicates with the first inner passage;
the first non-return valve is included along the first discharge channel;
the second discharge channel communicates with the second inner passage; and
the second non-return valve is included along the second discharge channel.

7. The handler according to claim 6, wherein:
the second discharge channel is connected with the first discharge channel; and the first non-return valve is included along the first discharge channel and disposed on an upstream side of the connection point between the first and second discharge channels.

8. The handler according to claim 7, wherein the first discharge channel includes a temperature raising unit disposed on a downstream side with respect to the connection point between the first and second discharge channels to raise the temperature of gas flowing through the first discharge channel.

9. The handler according to claim 8, wherein a third non-return valve is provided along the first discharge channel on a downstream side of the temperature raising unit to regulate gas flow into the temperature raising unit.

10. A part inspecting apparatus, comprising:
a stage on which a part is supported;
a supply unit to which liquefied gas produced by liquification of gas is supplied;
a supply channel which connects the supply unit and a passage within the stage;
a valve which opens and closes the supply channel;
a heater which heats the stage;
a temperature sensor which detects a temperature of the stage;
a controller which controls an output of the heater and opening and closing of the valve such that the temperature detected by the temperature sensor becomes a predetermined temperature;
a vaporization vessel included along the supply channel and having a larger flow path cross-sectional area than a flow path cross-sectional area of the supply channel to vaporize the liquefied gas; and
a tester which inspects the part.

11. A handler, comprising:
a stage supporting a part;
a heater which heats the stage;
a supply unit to which liquefied gas is supplied;
a supply channel communicatively connected downstream of the supply unit and upstream of a passage within the stage;
a valve disposed along the supply channel;
a vaporization vessel disposed along the supply channel upstream of the passage and downstream of the valve to vaporize the liquefied gas, the vaporization vessel having a larger flow path cross-sectional area than the supply channel; and
a controller which controls the heater and the valve to control a temperature of the stage.

12. The handler according to claim 11, further comprising:
a housing which houses the stage; and
a discharge channel connecting the passage and an interior of the housing vessel.

13. The handler according to claim 12, further comprising:
a non-return valve provided along the discharge channel to regulate gas flow of into the passage.

* * * * *